United States Patent [19]

Kamo et al.

[11] Patent Number: 4,663,684
[45] Date of Patent: May 5, 1987

[54] MAGNETIC TRANSDUCER USING MAGNETORESISTANCE EFFECT

[75] Inventors: Yoshihisa Kamo, Kokubunji; Naoki Sato, Hachioji; Masahiro Kitada, Nishitama; Tooru Takeura, Odawara, all of Japan

[73] Assignee: Hitachi, Ltd., Tokyo, Japan

[21] Appl. No.: 694,764

[22] Filed: Jan. 25, 1985

[30] Foreign Application Priority Data

Jan. 27, 1984 [JP] Japan .................................. 59-11920
Jun. 20, 1984 [JP] Japan .................................. 59-125190
Aug. 24, 1984 [JP] Japan .................................. 59-174928
Oct. 12, 1984 [JP] Japan .................................. 59-212512

[51] Int. Cl.$^4$ ............................................. G11B 5/30
[52] U.S. Cl. ..................................... 360/113; 360/125
[58] Field of Search ................ 360/113, 122, 125-126; 338/32 R

[56] References Cited

U.S. PATENT DOCUMENTS 3,864,751  2/1975  Beaulieu et al. ................... 360/113
4,354,212 10/1982  Nouchi et al. ..................... 360/113
4,562,503 12/1985  Fujioka et al. ..................... 360/123

FOREIGN PATENT DOCUMENTS 52-67312  3/1977 Japan .................................. 360/113
58-185020 10/1983 Japan .................................. 360/113

OTHER PUBLICATIONS

IBM/TDB, vol. 19, No. 7, Dec. 1976, pp. 2430-2431, "Magnetoresistive Head Element", by Cheatham et al.
IEEE Transactions on Magnetics, vol. MAG-17, No. 6, Nov. 1981, "High-Track-Density . . . Head", by Kelley et al., pp. 2890-2892.

*Primary Examiner*—John H. Wolff
*Attorney, Agent, or Firm*—Antonelli, Terry & Wands

[57] ABSTRACT

Disclosed is a magnetic transducer using a magnetoresistance effect, comprising a magnetoresistive film, a hard magnetic film for applying a transverse biasing magnetic field thereto, and a conductive film through which current for applying the transverse biasing magnetic field to the magnetoresistive film flows. The conductive film may be either in electrical contact with or in electrical insulation from the magnetoresistive film. In this magnetic transducer, even when the heights of the respective constituents have changed, the transverse biasing magnetic field to be applied does not change considerably, and an optimum bias field strength is readily attained.

21 Claims, 37 Drawing Figures

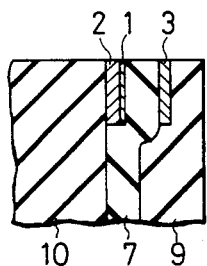
FIG. 9a
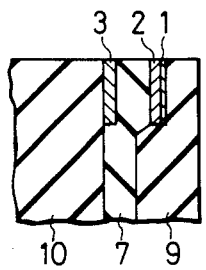
FIG. 9b
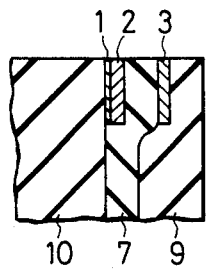
FIG. 9c
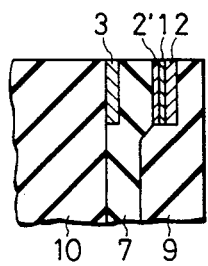
FIG. 10
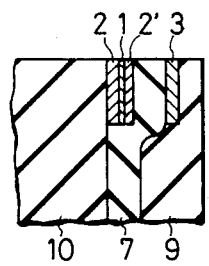
FIG. 11
FIG. 12
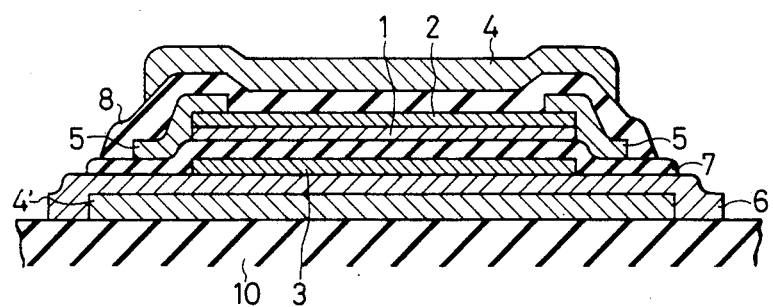

MAGNETIC TRANSDUCER USING MAGNETORESISTANCE EFFECT

BACKGROUND OF THE INVENTION

The present invention relates to a magnetic transducer which employs a magnetoresistive element, and more particularly to a structure which is well suited to apply a transverse biasing magnetic field to a magnetoresistive element.

A magnetoresistive element (hereinbelow, written "MR element") exploits the fact that the resistance R of the MR element is varied by a magnetic field H to which the MR element is subjected. As shown in FIG. 1, the resistance variation is a nonlinear variation. Accordingly, in order to construct a magnetic transducer of high efficiency by detecting the nonlinear resistance variation, the operating point of the MR element needs to be shifted to point B indicated in FIG. 1, that is, a magnetic field $H_b$ needs to be applied beforehand, thereby to improve the linearity of the resistance variation of the MR element and to enhance the sensitivity of the element. The magnetic field $H_b$ applied in advance is called the "transverse biasing magnetic field".

As expedients for applying the transverse biasing magnetic field to the MR element, there have been proposed various methods, for example, one wherein as disclosed in the official gazette of Japanese Patent Application Laying-open No. 49-74522 or No. 49-74523, currents are caused to flow through both a magnetoresistive film (hereinbelow, written "MR film") and a conductive film which is disposed in close contact and electrical contact with the MR film, and a magnetic field generated by the current flowing through the conductive film is used as the transverse biasing magnetic field, and one wherein as disclosed in the official gazette of Japanese Patent Application Laying-open No. 50-1712, a hard magnetic film is arranged in proximity to an MR film, and a magnetic field generated by the residual magnetization of the hard magnetic film is used as the transverse biasing magnetic field.

With those methods of the prior arts which have been disclosed in the official gazettes of Japanese Patent Application Laying-open Nos. 49-74522 and 49-74523, in order to attain a sufficient bias field strength, the resistance of the conductive film needs to be rendered lower than that of the MR film thereby to permit a great current to flow. For this reason, the resistance variation of the MR film is short-circuited by the conductive film, and it has been impossible to expect a great output in case of constructing a magnetic transducer.

In the prior arts, no regard has been paid to the difficulty that the bias field strength changes due to changes in the height of the MR film and the height of the conductive film or the hard magnetic film for generating the transverse biasing magnetic field, so the output and linearity of a magnetic transducer change. In case of constructing the magnetic transducers with these prior arts, therefore, the heights of the MR film and the conductive film or hard magnetic film for applying the transverse biasing magnetic field need to be held at high precision. Another problem is that, when the magnetic transducer reproduces a signal in contact with a magnetic recording medium, the film height changes due to wear, and the film height change incurs degradation in the linearity, so the magnetic transducer fails to operate normally.

The following references are cited to show the state of the art; (i) Official Gazette of Japanese Patent Application Laying-open No. 49-74522, corresponding to U.S. Pat. No. 3,814,863; (ii) Official Gazette of Japanese Patent Application Laying-open No. 49-74523, corresponding to U.S. Pat. No. 3,840,898; (iii) Official Gazette of Japanese Patent Application Laying-open No. 50-1712, corresponding to U.S. Pat. No. 3,813,692.

DESCRIPTION OF THE INVENTION

An object of the present invention is to provide a magnetic transducer using a magnetoresistance effect in which a sufficient transverse biasing magnetic field is applied to an MR element so as to attain a high output, and in which the rate of change of the transverse biasing magnetic field is suppressed to the utmost relative to the rates of changes of the heights of an MR film and a conductive film or a hard magnetic film for applying the transverse biasing magnetic field, so as to reduce changes in characteristics.

In order to accomplish the object, the magnetic transducer using a magnetoresistance effect according to the present invention comprises (i) an MR film, (ii) a hard magnetic film which applies a transverse biasing magnetic field to said MR film without lying in electrical contact with said MR film, and (iii) at least a conductive film, consisting of either (1) a conductive film which is stacked on said MR film in electrical contact with said MR film or (2) a conductive film which is stacked on said MR film without electrical contact with said MR film (that is, through an insulating layer).

The inventors have found out newly that a magnetic field generated by the hard magnetic film and a magnetic field generated by causing current to flow through the conductive film have the property of being complementary to each other with respect to changes in the heights of the films. The magnetic transducer of the present invention has been constructed on the basis of the new finding, so as to apply the transverse biasing magnetic field to the MR film by combining the magnetic field generated by the hard magnetic film and the magnetic field generated by the current flowing through the conductive film.

The MR film is formed of a thin film of a magnetic material of small coercive force such as an Ni-Fe alloy (the so-called permalloy), Ni-Co alloy or Ni-Fe-Co alloy. Preferably, it has a thickness of 50 Å–1000 Å.

The material of the hard magnetic film should preferably be one, for example, a Co-Cr alloy, Co-Ni alloy or Co-Pt alloy, which can be readily deposited by a thin film forming method such as vapor deposition or sputtering and which can be readily patterned by the use of photolithographic techniques such as various etching operations and ion milling. Preferably, the thickness of the hard magnetic film is set at 100 Å–3000 Å.

An insulating film which is interposed between the MR film and the hard magnetic film, in order to electrically insulate them, is recommended to have the smallest possible thickness, preferably a thickness of 500 Å or less, as long as a favorable electrical insulation is attained, in order that the magnetic field established by the hard magnetic film may effectively act on the MR film. Usually used as the material of the insulating film is an inorganic insulator such as $Al_2O_3$ or $SiO_2$ or an organic insulator such as resin.

Regarding the material of the conductive film, in the case where this conductive film is provided in electrical contact with the MR film, an electrically conductive material which is different from the material of the MR film used and which can be formed into a thin film is employed. In particular, a material which is difficult to cause a diffusion reaction with the MR film is preferable. For example, Mo, Ti, Au, Ta or Nb is usually employed. In the case where the conductive film is provided without electrical contact with the MR film, it may be an electrically conductive material which can be formed into a thin film.

The case of providing the conductive film in electrical contact with the MR film has the effect that, even when defects exist in the MR film, any fault ascribable thereto is avoided. In this case, it is necessary for a satisfactory reliability of the MR element that the conductive film lies in close contact with substantially the whole area of at least one surface of the MR film (both the films shall lie in electrical contact at the close contact area), and it is desirable that the conductive film lies in close contact with the whole area of at least one surface of the MR film substantially perfectly. However, even when the conductive film lies in close contact with only a part of the MR film, the reliability of the MR element becomes higher than in a case of providing no conductive film in close contact.

In the case of providing the conductive film in electrical contact with the MR film, the electric resistance of the conductive film is set to be 0.05 time-3 times that of the MR film, preferably 0.1 time-2 times, and more preferably 0.6 time-1.5 times. When the electric resistance of the conductive film is still higher, unfavorably the enhancement of the reliability of the element is slight, whereas when it is still lower, unfavorably the output of the element decreases. The thickness of the conductive film may be decided so as to establish the electric resistance specified above. Of course, the thickness of the conductive film is increased for lowering the electric resistance of this conductive film, and it is decreased for raising the electric resistance. In a case where the conductive film in electrical contact with the MR film and the conductive film without electrical contact with the MR film are both provided, the electric resistance of the former may well be rendered above 3 times that of the MR film.

In the case of providing the conductive film without electrical contact with the MR film, the conductive film may allow current of a predetermined magnitude to flow therethrough, and the range of electric resistances need not be especially stipulated therefor. In general, the lower specific resistance of the conductive film assures a higher versatility of design because the conductive film need not be thickened.

In any of the above cases, the thickness of the conductive film needs to be at least 150 Å. When it is less than 150 Å, unfavorably no sound film is obtained in some cases.

The MR element usually has a structure wherein the necessary films of the MR film etc. are disposed on a substrate. The conductive film may be provided on the surface of the MR film close to the substrate (hereinafter, termed the "lower surface") or/and the surface thereof remote from the substrate (hereinafter, termed the "upper surface") directly or through the insulating layer.

Using any of well-known processes for manufacturing a thin film such as vapor deposition, sputtering and chemical vapor deposition, the conductive film is deposited on the MR film directly or through the insulating film or on the predetermined substrate on which the MR film is not deposited yet (the substrate on which one or two or more necessary thin films have already been provided shall also be included).

The magnetic transducer using a magnetoresistance effect of the present invention comprises the hard magnetic film for applying the transverse biasing magnetic field to the MR film, as stated above, so that the current to flow through the conductive film can be rendered lower than in the prior arts disclosed in the official gazettes of Japanese Patent Application Laying-open No. 49-74522 etc. In consequence, in the case where the conductive film and the MR film are provided in electrical contact, the resistance of the conductive film need not be very low, and the output of the MR element can be rendered sufficiently great. In this case, because of the conductive film deposited on the surface of the MR film, even when the current through the MR film is difficult to flow due to defects existing in the MR film, the conductive film serves as a bypass and permits a sufficient current to flow, so that current concentration ascribable to the defects of the MR film and any fault attendant thereupon can be avoided.

In the case where the conductive film is provided without electrical contact with the MR film, there is eliminated the difficulty in the prior arts that the resistance variation of the MR film is short-circuited by the conductive film to lower the output.

Whether the conductive film is held in electrical contact with the MR film or not, a magnetic field based on the current flowing through the conductive film can also be expected to constitute the transverse biasing magnetic field in the magnetic transducer of the present invention. Therefore, some excess or deficiency of the bias can be compensated to establish the optimum bias field strength by adjusting the current which flows through the conductive film.

Now, there will be explained the principal effect of the present invention, namely, the alleviation or prevention of the change of the bias field strength attributed to the changes of the heights of the MR film, conductive film and hard magnetic film.

It is known that, in order to apply the transverse biasing magnetic field to the MR film, a hard magnetic body or a permanent magnet is arranged in proximity to the MR film, and through an insulating film if necessary. However, when the permanent magnetic film is disposed in a manner to be stacked on the MR film through the insulating film, the strength of the transverse biasing magnetic field shows a tendency to lower in the middle part of the MR film. This tendency becomes more conspicuous as the height of the MR film (h in FIG. 3b to be described in detail later, taken in a direction perpendicular to the surface of the transducer facing a recording medium) is greater. With such prior-art magnetic transducer using a magnetoresistance effect, accordingly, unfavorably the bias field strength changes when the height of the MR film has changed as in, for example, a case where the surface of a magnetic head facing the recording medium has worn off. In contrast, in the presence of the conductive film as in the magnetic transducer of the present invention, the transverse biasing magnetic field based on the current flowing through the conductive film shows a tendency to rise in the middle part, and it can compensate the tendency in which the bias field strength of the middle part lowers in the presence of only the permanent magnetic film. Thus, the change of the transverse biasing magnetic field attributed to the change of the height of the MR element can be alleviated or prevented.

As is well known, a magnetoresistive element can be applied to the magnetic transducer of a magnetic head for reproduction, etc. In this case, it is desirable for enhancing the resolution of the magnetic transducer that soft magnetic films as shields are arranged on both the sides of the element (usually, "both the sides" shall be both the sides of the portions of the element except the substrate) through insulating films so as to sandwich therebetween the principal portions of the MR element (usually, the principal portions are the MR film, means for applying the transverse biasing magnetic field, and required insulating films, and electrodes may well be included). The soft magnetic film can be replaced with a soft magnetic substrate. It is needless to say that also the magnetic head etc. employing the magnetic transducer using a magnetoresistance effect of the present invention has the advantages of the present invention.

In the magnetic transducer using a magnetoresistance effect of the present invention, information already known in the technical field concerned may be utilized for matters not described in the specification.

BRIEF DESCRIPTION OF THE DRAWINGS

FIGS. 9a, 9b and 9c are sectional views each showing a modification of the magnetic transducer in the first embodiment of the present invention;

FIG. 10 is a sectional view of a magnetic transducer in the second embodiment of the present invention;

FIG. 11 is a sectional view showing a modification of the magnetic transducer in the second embodiment of the present invention;

FIG. 12 is a sectional view of a magnetic transducer in the third embodiment of the present invention, taken in parallel with its surface facing a recording medium;

DESCRIPTION OF THE PREFERRED EMBODIMENTS

Embodiment 1

Figure 1:
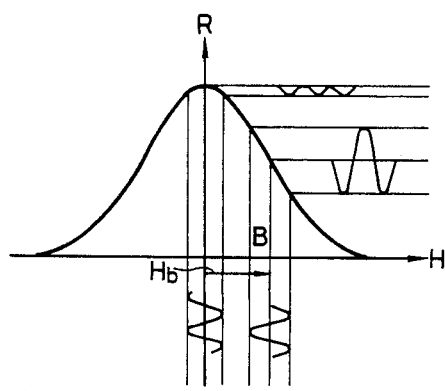
FIG. 1 is a graph for explaining the relationship between the strength of a magnetic field acting on a magnetoresistive element and the resistance of the element.
Figure 2:
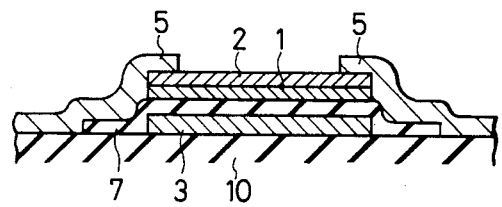
FIG. 2 is a sectional view parallel to a surface facing a recording medium, showing a magnetic transducer in the first embodiment of the present invention.
Figure 3A:
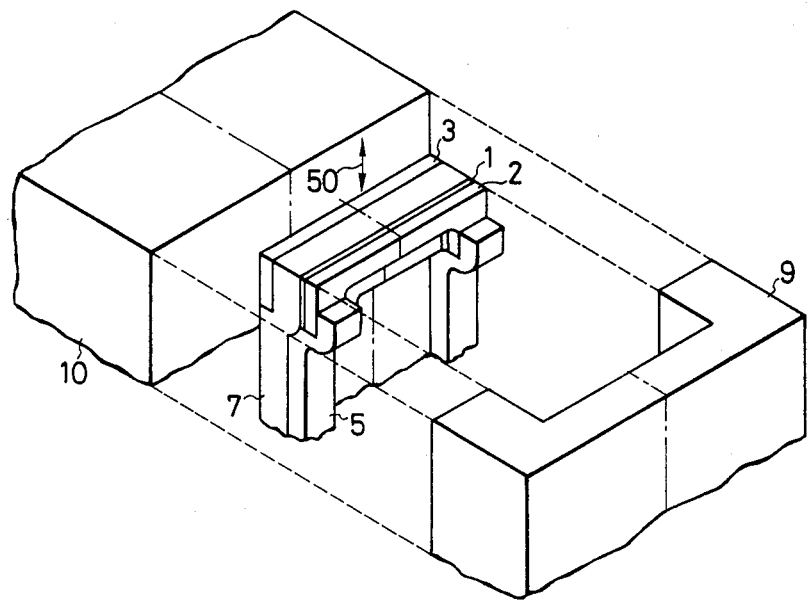
FIGS. 3a and 3b are an exploded perspective view and a sectional view showing a more practicable example of the magnetic transducer in the first embodiment, respectively.
Figure 3B:
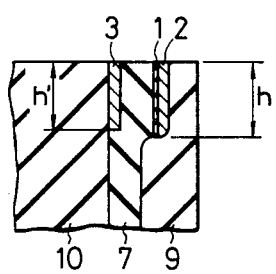

FIG. 2 shows the sectional structure of a magnetic transducer, using a magnetoresistance effect, in this embodiment, the structure being taken in parallel with the surface of the transducer facing a recording medium. FIG. 3a is an exploded perspective view showing the structure of a more practicable example of the embodiment, while FIG. 3b is a sectional view of parts indicated by dot-and-dash lines in FIG. 3a. On a substrate 10 which is made of ceramics, glass, $Al_2O_3$, $SiO_2$ or any other desired nonmagnetic material, a hard magnetic film (permanent magnetic film) 3 which is made of a hard magnetic material, for example, a Co-Cr alloy, Co-Ni alloy or Co-Pt alloy, deposited by vapor deposition or sputtering and patterned by the use of a photolithographic technique such as etching or ion milling is arranged at substantially the same height h' as the height h of an MR film 1. The MR film 1 is formed of a thin film made of a magnetic material of small coercive force such as an Ni-Fe alloy (e.g., permalloy), Ni-Co alloy or Ni-Fe-Co alloy, and it is arranged at the height h so as to lie in contact with the hard magnetic film 3 through an insulating film 7 which is made of an inorganic insulator such as Al₂O₃ or an organic insulator such as photoresist or resin. Further, a conductive film 2 acting as a shunt biasing film is formed on the MR film 1 at the same height h as that of the MR film, the film 2 being made of a material, for example, titanium (Ti) or molybdenum (Mo), which is difficult of a diffusion reaction with the above material of the MR film and has a resistivity not greatly different from that of the MR film and which can be readily formed by a thin film depositing process such as vapor deposition or sputtering and a patterning technique such as photolithography. Further, electrodes 5 which are made of a material of low resistivity, for example, gold (Au) or aluminum (Al) are disposed on the conductive film 2 in order to detect the resistance variation of the MR film. Further disposed thereon is an insulating film 9(shown in FIGS. 3a and 3b, but not shown in FIG. 2 which is made of an inorganic insulator such as Al₂O₃ or SiO₂ or an organic insulator such as photoresist or resin and which covers the aforementioned MR film 1, conductive film 2, electrodes 5, etc. to protect them from mechanical damages, corrosion, etc. Here, the MR film 1, insulating film 7, electrodes 5, insulating material 9, etc. can of course be readily formed by the techniques of vapor deposition, sputtering, photolithography, etc. likewise to the hard magnetic film 3 and tne conductive film 2. Accordingly, the present embodiment can be entirely formed at high precision by vapor deposition, sputtering, photolithography etc.

After the magnetic transducer has been formed into such structure, a magnetic field the strength of which brings the hard magnetic film 3 to a predetermined residual magnetism is applied in the direction of arrow 50 in FIG. 3a from outside the magnetic transducer, thereby to magnetize the hard magnetic film 3.

As already stated, as the important effect of the present invention, it is possible to compensate the non-uniform distribution of a transverse biasing magnetic field in the case of employing the permanent magnetic film for the application of the transverse biasing magnetic field. Now, this effect in the present embodiment will be described in detail.

Figure 4:
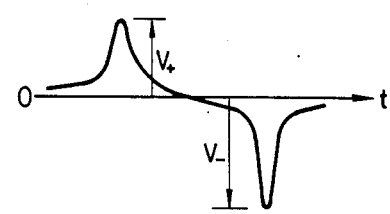
FIG. 4 is a diagram for explaining the degree of vertical symmetry of a signal waveform reproduced by a magnetoresistive element.

In general, when a magnetoresistive element has an improper value as its transverse biasing magnetic field strength, a recorded signal of a waveform whose plus side and minus side are balanced (namely, which is vertically balanced) is reproduced into a signal waveform which is vertically unbalanced. The reproduced signal waveform in the case of an insufficient bias field strength is shown in FIG. 4. Letter t in FIG. 4 indicates the time. Letting $V_+$ denote the peak value of the reproduced signal waveform on the plus side, and $V_-$ denote the peak value thereof on the minus side, the degree of vertical symmetry $\Delta$ of the reproduced signal waveform is indicated by the expression of $$\Delta = \frac{V_+ - V_-}{V_+ + V_-} \times 100 \ (\%).$$

At $\Delta = 0$, the symmetry is favorable, and the transverse biasing magnetic field lies at the optimum bias point; at $\Delta < 0$, the transverse biasing magnetic field is smaller than the optimum bias; and at $\Delta > 0$, the former is greater than the latter contrariwise. The relations between this degree $\Delta$ and the height h of the MR film 1, the conductive film 2 for applying the transverse biasing magnetic field and the hard magnetic film 3 were investigated, and have been found to become as shown in FIG. 5.

Figure 5:
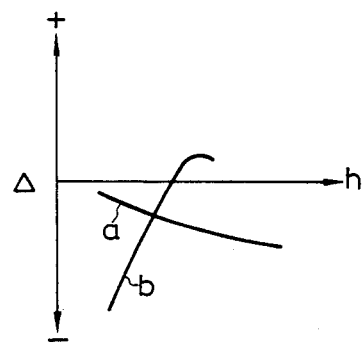
FIG. 5 is a graph showing the relationship between the height of the magnetoresistive element and the degree of vertical symmetry of the reproduced signal waveform.
Figure 6:
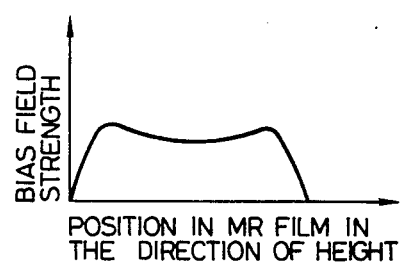
FIG. 6 is a diagram showing the transverse biasing magnetic field distribution of a permanent magnetic film.

Curve a in FIG. 5 shows a case where the transverse biasing magnetic field was applied by the use of only the permanent magnetic film, and where $\Delta$ increases with decrease in h. In order to facilitate understanding of this phenomenon, FIG. 6 shows the transverse biasing magnetic field distribution in the direction of the height of the MR film 1. When the height h is smaller, the magnitude of concaveness of the transverse biasing magnetic field in the middle part of the MR film 1 is smaller than that arising when the height h is greater, and hence, the transverse biasing magnetic field as an average value becomes greater, resulting in the relation as shown by the curve a in FIG. 5.

Figure 7:
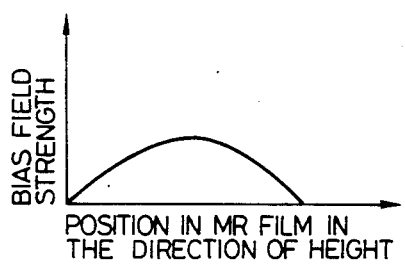
FIG. 7 is a diagram showing the transverse biasing magnetic field distribution in the case where current is caused to flow through a conductive film.

On the other hand, curve b in FIG. 5 shows a case where the transverse biasing magnetic field was applied by the use of only the conductive film in such a way that the MR film 1 and the conductive film 2 were driven by a constant voltage, and where $\Delta$ decreases with decrease in h. In order to facilitate understanding of this phenomenon, FIG. 7 shows the transverse biasing magnetic field distribution in the direction of the height of the MR film 1. When h is smaller, the resistance of the MR film 1 as well as the conductive film 2 becomes higher, and current flowing through the conductive film 2 becomes less than that flowing when h is greater, so that the transverse biasing magnetic field as an average value becomes smaller, resulting in the relation as shown by the curve b in FIG. 5.

Owing to the discovery of the property that the trends of the changes of $\Delta$ versus the changes of h are opposite to each other between both the cases in this manner, it has been found possible to obtain the new effect that, by combining both the phenomena described above, $\Delta$ hardly changes even when h has changed. Accordingly, the present invention is characterized by a construction in which the two sorts of bias applying means described above are combined, namely, in which the transverse biasing magnetic field is applied to the MR film by means of the magnetic field established by the permanent magnetic film and the magnetic field established by the current flowing through the conductive film.

The present embodiment employs the conductive film functioning as the shunt biasing film, which is disposed in electrical contact with the MR film, and it utilizes a magnetic field established by a current shunted to the conductive film (shunt biasing film) from a current which is caused to flow in order to sense the resistance variation of the MR film.

Figure 8:
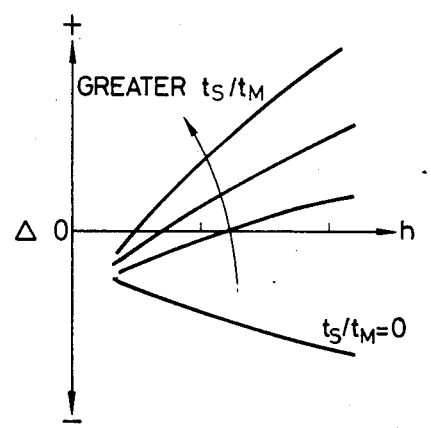
FIG. 8 is a graph showing the relationship between the height of an MR film and the degree of vertical symmetry of a reproduced signal waveform in the first embodiment of the present invention.

It is FIG. 8 that shows the relationship in such magnetic transducer of the present embodiment between the height h of the MR film 1 and the degree of vertical symmetry $\Delta$ of the reproduced signal waveform depicted in FIG. 4. The current to flow through the MR film 1 needs to be set at the optimum value, depending upon the sensitivity of the magnetoresistance effect, the reliability of the MR element, etc. The ratio $t_S/t_M$ between the thickness $t_M$ of the MR film 1 and the thickness $t_S$ of the conductive film 2 functioning as the shunt biasing film is greatly contributive to the current shunting ratio which is determined by the respective resistivities and thicknesses $t_M$, $t_S$ of the MR film 1 and the conductive film 2, and therefore to the bias field strength which is established by the current flowing through the conductive film 2. Accordingly, the relationship between the height h of the MR film and the bias field strength or the degree of vertical symmetry $\Delta$ of the reproduced signal waveform changes depending upon the value of $t_S/t_M$. As illustrated in FIG. 8, at $t_S/t_M=0$, that is, in the case where only the hard magnetic film 3 to serve as the permanent magnetic film is disposed without providing the conductive film 2, $\Delta$ tends to increase with the decrease of h as stated before, whereas as $t_S/t_M$ is gradually increased, the tendency of the change of $\Delta$ versus the change of h reverses, and the rate of the change increases. In this way, when $t_S/t_M$ is set at the optimum value, in other words, when the shunting ratio of the current to be shunted by the MR film 1 and the conductive film 2 is set at the optimum value which takes into consideration the rate of contribution of the bias field strength established by the hard magnetic film 3, to $\Delta$ versus the height h of the MR film, $\Delta$ comes to hardly change even at the change of h.

Further, it has been stated before that $\Delta=0$ is the best, and in order to realize $\Delta=0$, the bias field strength to be obtained by combining the magnetic fields respectively established by the hard magnetic film 3 and the conductive film 2 may be set so as to come to the optimum bias point.

A more practicable example of the present embodiment will be mentioned. When the remanence of the hard magnetic film 3 is 3000 gausses, the thickness thereof is 1000 Å, the thickness of the insulating film 7 is 2000 Å and the current density of the current flowing through the conductive film 2 is $1.7 \times 10^{10}$ A/m$^2$, $\Delta$ becomes $-5$ to $+5\%$ and the rate of change is within 10% in case the height of the MR film 1 falls within a range of 5-20 μm.

In the case where the means for applying the transverse biasing magnetic field consists only of the permanent magnetic film, the rate of change of $\Delta$ is about 20% within the range within which h is 5-20 μm. In the case where the constant-voltage drive is performed by the use of only the conductive film functioning as the shunt biasing film, the rate of change of $\Delta$ is 50-60%. It is therefore understood that, according to the present embodiment, the rate of change of $\Delta$ versus the change of h becomes much smaller.

To the end of bringing to the optimum bias point the bias field strength which results from the magnetic fields respectively established by the hard magnetic film 3 and the current flowing through the conductive film 2, it is not advisable to greatly change the value of the current to flow through the conductive film 2 for the purpose of rendering slight the change of $\Delta$ versus the change of h as stated above, and it is favorable to principally change the field strength to be established by the hard magnetic film 3. The field strength which is applied to the MR film 1 by the hard magnetic film 3 can be adjusted by the distance between the MR film 1 and the hard magnetic film 3, namely, the thickness of the insulating film 7, the material and thickness of the hard magnetic film 3, the intensity of magnetization of the hard magnetic film 3, etc. Of course, it may well be adjusted by the material and thickness of the hard magnetic film 3, etc. mentioned above, but among them, the intensity of magnetization is the most desirable with which the dispersion of manufacture can be absorbed because the field strength can be adjusted after manufacturing the magnetic transducer into the predetermined setup. By way of example, the hard magnetic film 3 is made of a material affording a maximum remanence of at least 5000 gausses, e.g., a cobalt-platinum (Co-Pt) alloy and is rendered 1000 Å thick, and the insulating film 7 is rendered 2000 Å thick, whereupon after the completion of the manufacture of the magnetic transducer, the hard magnetic film 3 is magnetized at approximately 3000 gausses being a remanence lower than a field strength with which this hard magnetic film is saturated. More actually, an adjusting operation is performed in which, while the foregoing quantity $\Delta$ is being measured, the hard magnetic film 3 is subjected to and magnetized at a field strength rendering $\Delta$ substantially zero.

As seen from the above, when the bias field strength which results from the magnetic fields respectively established by the hard magnetic film 3 and the current flowing through the conductive film 2 becomes the optimum bias point or higher, the material and thickness of the hard magnetic film 3 and the thickness of the insulating film 7 need not be restricted.

Likewise, when the transverse biasing magnetic field to be applied to the MR film 1 by the magnetic field established by the current flowing through the conductive film 2 is the optimum value which takes into consideration the rate of contribution of the bias field strength applied by the hard magnetic film 3, to $\Delta$ versus the height h of the MR film, in other words, when the current flowing through the conductive film 2 is at the optimum current density, the material and thickness of the conductive film 2 need not be restricted.

In the above embodiment, there have been stated the effects in the case where the height h of the MR film 1 as well as the conductive film 2 is substantially equal to the height h' of the hard magnetic film 3. The correlation of these heights, however, does not limit the foregoing effect that the rate of change of the degree of vertical symmetry $\Delta$ of the reproduced signal waveform versus the change of the height h of the MR film can be lessened. More specifically, in both the case of $h > h'$ and the case of $h < h'$, the transverse biasing magnetic field which is applied to the MR film 1 owing to the hard magnetic film 3 depends upon h', so that when the heights h and h' change simultaneously, the magnitude of change of the transverse biasing magnetic field to be applied to the MR film 1 owing to the hard magnetic film 3 is quite equal to a value in the case of $h = h'$. The mutual relations of the heights of the foregoing constituents hold true for several embodiments to be described later.

When the magnetic transducer is constructed as in the present embodiment, the rate of change of $\Delta$ dependent upon h can be lessened as stated before. Therefore, the performance of the magnetic transducer disperses little, and the available percentage of manufacture is enhanced. Moreover, the machining precision at the finish machining of the front surface of the magnetic transducer is relieved to facilitate the manufacture. Accordingly, the effect of lowering the cost of manufacture is also produced.

Even in an application wherein the front surface of the magnetic transducer is rubbed by a recording medium or the like, so the height of the MR film changes during use, $\Delta$ is stable for a long term, and the lifetime of the magnetic transducer depending upon wear lengthens.

Further, in the present embodiment, the value of the current of the conductive film to be shunted from the MR film is smaller than in the case of applying the transverse biasing magnetic field by the use of only the conductive film. Therefore, the so-called magnetoresistivity which is the resistance variation rate relative to the flux variation to be sensed by the magnetic transducer improves to enhance the reproducing efficiency and to enhance the performance of the reproducing sensitivity of the magnetic transducer.

In the case of applying the transverse biasing magnetic field with only the hard magnetic film, the thickness of the MR film is as very small as 50-1000 Å as described before, the defects of the film are liable to appear, and current concentration takes place in the defects due to the flow of the current, so that the film becomes liable to sever. In contrast, in the case of the present embodiment, even when the defects of the film are existent, the current is bypassed to the conductive film, and hence, the reliability is enhanced in that the risk of the severance of the MR film lessens.

Fundamentals for the present embodiment to have the foregoing effects are that the hard magnetic film in electrical insulation from the MR film and the conductive film in electrical contact with the MR film are comprised as the films for applying the transverse biasing magnetic field, and that the appropriate bias field strength is applied to the MR film by combining the magnetic fields established by the respective films. Therefore, even when the respecitve positions of the hard magnetic film 3, MR film 1 and conductive film 2 are changed with respect to the substrate 10, effects do not differ from those of the present embodiment at all. By way of example, FIGS. 9a-9c show sectional structures similar to that of FIG. 3b, and they differ merely in the mutual positions of the respective constituents. Symbols indicating the constituents in each figure are identical to the symbols mentioned before.

Embodiment 2

FIG. 10 shows a typical example of a magnetic transducer, using a magnetoresistance effect, in the present embodiment, and is a sectional view similar to FIG. 3b. In Embodiment 1, the conductive film 2 functioning as the shunt biasing film is arranged on only one side of the MR film 1, whereas in the present embodiment, a conductive film 2' is arranged also on the opposite side of the MR film 1. The other portions have the same constructions and materials as in Embodiment 1. As in the foregoing description of Embodiment 1, the conductive films 2 and 2' functioning as the shunt biasing films are formed of the material, e.g., titanium (Ti) or molybdenum (Mo), which is difficult to cause a diffusion reaction with the material of the MR film and which has a resistivity not greatly different from that of the MR film. The thickness of the conductive film 2' is preferably rendered at least 300 Å, while the thickness of the conductive film 2 is set so as to give an appropriate current value as the value of the current flowing through this conductie film 2, according to the thickness of the conductive film 2', in other words, the value of current flowing through the conductive film 2'. Regarding the expression "appropriate current value", magnetic fields generated by the currents flowing through the respective conductive films 2' and 2 are applied to the MR film 1 in directions opposite to each other, and the appropriate current value signifies a current value with which the combined transverse biasing magnetic field to be applied to the MR film 1 becomes the optimum value that takes into consideration the rate of contribution of the bias field strength to be applied by the hard magnetic film 3, to the degree of vertical symmetry $\Delta$ of the reproduced signal waveform versus the height h of the MR film as in the foregoing description of Embodiment 1.

By way of example, when the remanence of the hard magnetic film 3 is rendered 3000 gausses (of course, as described before in Embodiment 1, after completion of the manufacture of the magnetic transducer employing the material which affords the maximum remanence of at least 5000 gausses, the intensity of magnetization of the hard magnetic film 3 may well be adjusted while the degree of vertical symmetry $\Delta$ of the reproduced signal waveform is being measured) and the thickness thereof is rendered 1000 Å, the thickness of the insulating film 7 is rendered 2000 Å, and the current density of the current to flow through the conductive film 2' is rendered $1.7 \times 10^{10}$ A/m$^2$ and the thickness of the film is rendered 500 Å, the value of the current to flow through the conductive film 2 is set to be 2-5 times higher than the value of the current to flow through the conductive film 2'.

Thus, when the height h of the MR film 1 falls within a range of 5-20 $\mu$m, the degree of vertical symmetry $\Delta$ of the reproduced signal waveform becomes $-7$ to $+7$ %. The rate of change is somewhat larger than in Embodiment 1, but the present embodiment is effective as compared with the prior art.

In the present embodiment, the shunting ratio of the currents flowing through the conductive films 2' and 2 is greater than the shunting ratio in Embodiment 1, so that the reproducing sensitivity based on the magnetoresistance effect lowers to some extent. The reproducing sensitivity, however, is equal to or is somewhat enhanced more than that of the structure wherein the transverse biasing magnetic field is applied with only the conductive film.

As the most important feature, the present embodiment is effective in a case where the MR film 1 is as very thin as 500 Å or less.

As regards the magnetic transducer, the surface for reading a flux variation, for example, the surface of a magnetic head facing a magnetic recording medium, is usually finish-machined at high precision. On this occasion, when the MR film 1 is contacted even on only one side by a very hard material difficult of machining such as an inorganic insulating film, the MR film 1 is liable to damages. Moreover, as the MR film 1 is thinner, greater influence is exerted on the magnetoresistance effect characteristics thereof. In the present embodiment, the conductive films made of an electrically conductive material which is softer than the inorganic insulating film though slightly are arranged on both the sides of the MR film 1 and function like protective films during the machining step, so that the MR film 1 is less liable to damages when the surface is finish-machined. Accordingly, degradations in the magnetoresistance effect characteristics of the MR film 1 can be suppressed to the least.

Further, in a magnetic transducer which is so used that the surface of the magnetic transducer wears off due to contact by a recording medium, degradations in characteristics attributed to damages which the MR film 1 suffers become slight as in the case of executing the finish machining.

In the present embodiment, the conductive films 2 and 2' have been explained as being made of the same material. As stated before, however, the current of the appropriate current value according to the value of the current to flow through the conductive film 2' may be permitted to flow through the conductive film 2. It is therefore obvious that materials of unequal resistivities may well be used for the conductive films 2 and 2', and the materials and thicknesses of the conductive films 2 and 2' are not restricted.

The materials and thicknesses of the conductive films 2 and 2' can be selected much more freely in a case where the effect of reducing the damages ascribable to the machining or wear of the surface of the magnetic transducer is more important than the effect concerning the rate of change of the degree of symmetry $\Delta$ of the reproduced signal waveform versus the height h of the MR film 1. That is, when the rate of change of $\Delta$ is neglected, the materials and thicknesses of the conductive films 2 and 2' may be identical or equal.

FIG. 11 shows another example according to the present embodiment, and is a sectional view similar to FIG. 10. On a substrate 10 and in the order mentioned below, a conductive film 2, an MR film 1, a conductive film 2' and an insulating film 7 are formed, whereupon a hard magnetic film 3 is formed. This example differs only in the order of forming the constituents of the magnetic transducer from the embodiment shown in FIG. 10. It is to be understood that the operations and effects based on the hard magnetic film 3 and the arrangement of the conductive films 2 and 2' on both the sides of the MR film 1 are quite the same as in the embodiment shown in FIG. 10.

In both the embodiment shown in FIG. 10 and the embodiment shown in FIG. 11, even when the conductive films 2 and 2' are replaced with each other, a combined transverse biasing magnetic field to be applied to the MR film 1 by currents flowing through the conductive films 2 and 2' can be rendered the aforementioned best value in such a way that, for example, directions in which the currents flow are reversed to those in the foregoing embodiment. It is therefore obvious that quite the same operations and effects as in the present embodiment are brought forth.

EMBODIMENT 3

Figure 13A:
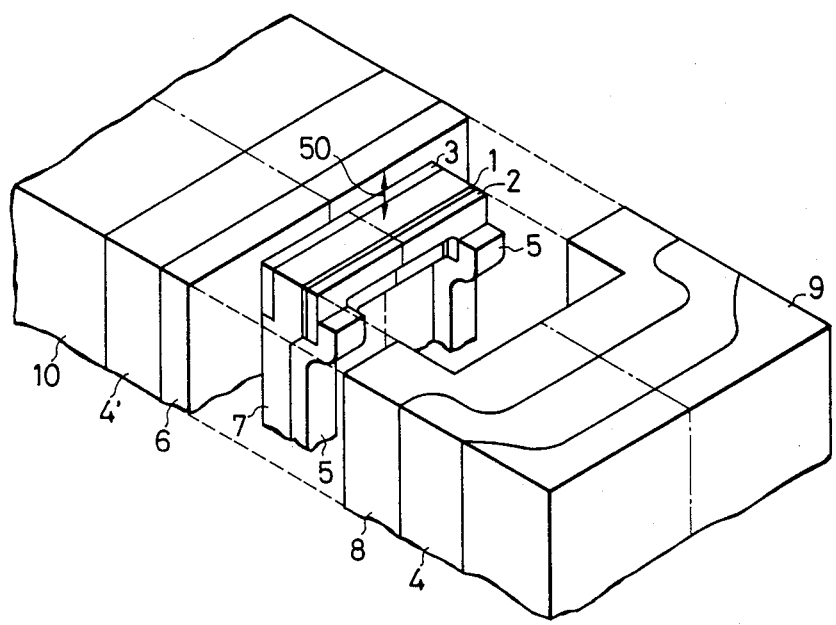
FIGS. 13a and 13b are an exploded perspective view and a sectional view showing a more practicable example of the magnetic transducer in the third embodiment of the present invention, respectively.
Figure 13B:
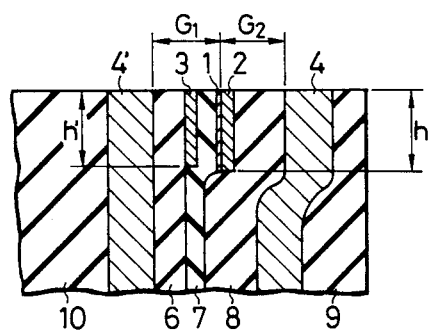

FIG. 12 shows the sectional structure of a magnetic transducer, using a magnetoresistance effect, in the present embodiment, taken in parallel with the surface thereof facing a recording medium. FIG. 13a is an exploded perspective view showing the structure of a more practicable example, while FIG. 13b is a sectional view of portions indicated by dot-and-dash lines in FIG. 13a. In the present embodiment, shields 4 and 4' which are made of a soft magnetic material (particularly, soft magnetic films) of high permeability, for example, a permalloy alloy or an amorphous alloy are arranged on both the outer sides of the hard magnetic film, MR film and conductive film of Embodiment 1 through insulating films 6 and 8, which are made of, for example, an inorganic material such as $SiO_2$ or $Al_2O_3$ or an organic material such as photoresist or resin.

The magnetic transducer of such structure is effective in a case where the bit length to be detected is minute, for example, 10 μm or less. The shields 4 and 4' have the function of magnetically shielding the MR film 1 so as not to absorb unnecessary magnetic fluxes, so that the resolution in reproduction is enhanced. It is needless to say that the distances $G_1$ and $G_2$ of the shields 4 and 4' from the MR film 1 need to be set at an optimum value in accordance with the minimum bit length to be detected.

With such structure, however, the magnetic fields established by the hard magnetic film 3 and the conductive film 2 are absorbed by the shields 4 and 4'. When the field strength to be established by the hard magnetic film 3 and the current flowing through the conductive film 2 remains the same value as in Embodiment 1, a sufficient field strength does not act on the MR film 1, and the degree of vertical symmetry $\Delta$ of a reproduced signal waveform described before worsens. In the present embodiment, accordingly, although the operating content of lessening the rate of change of the degree of vertical symmetry $\Delta$ of a waveform versus the changes of the respective heights h and h' of the MR film 1 as well as the conductive film 2 for applying the transverse biasing magnetic field and the hard magnetic film 3 is the same as in Embodiment 1, the transverse biasing magnetic field to be established by the hard magnetic film 3 and the current flowing through the conductive film 2 is rendered greater than in the case of Embodiment 1 in consideration of the magnitude of the magnetic flux to be absorbed by the shields 4 and 4'. Regarding the magnitude of the bias field strength to be increased, the magnitude of the magnetic flux to be absorbed by the shields 4 and 4' differs depending upon distances from the hard magnetic film 3 and conductive film 2 to the shields 4 and 4', roughly the values $G_1$ and $G_2$, and hence, a value suitable for occasional geometries is of course set as the magnitude to be increased.

Figure 14:
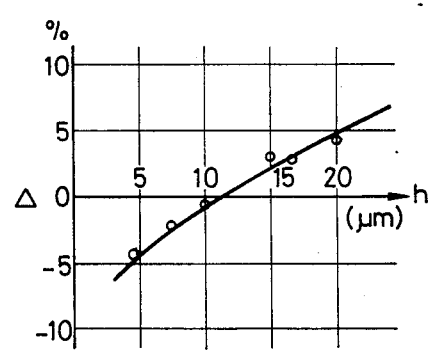
FIG. 14 is a graph showing an example of the relationship between the height of an MR film and the degree of vertical symmetry of a reproduced signal waveform in the third embodiment of the present invention.

A more concrete example of Embodiment 3 will be mentioned. When $G_1=G_2=0.8$ μm is set, the remanence of the hard magnetic film 3 is set at 8000 gausses and the thickness thereof is rendered 1000 Å, the thickness of the insulating film 8 is rendered 2000 Å and the current density of the current to be shunted to the conductive film 2 is set at $2\times10^{10}$ A/m$^2$, the relationship between h and $\Delta$ is as shown in FIG. 14, and $\Delta$ becomes $-5$ to $+5$ % to exhibit a favorable effect within the range in which h is 5–20 μm.

The present embodiment has the effects of curtailing the production cost on the basis of enhanced available percentage and easy manufacture, prolonging the lifetime of the magnetic transducer and enhancing the reliability against the defects of the MR film, likewise to the case of Embodiment 1, while at the same time the resolution in reproduction is good. That is, the present embodiment has also the effect that even signals of small bit length can be reproduced.

Important facts in the present embodiment are that the hard magnetic film 3 in electrical insulation from the MR film 1 and the conductive film 2 in electrical contact with the MR film 1 are comprised as the films for applying the transverse biasing magnetic field, and that even when the magnetic fields established by the respective films are absorbed by the shield films 4 and 4', they are combined to apply an appropriate bias field strength to the MR film. Therefore, as in the foregoing description of Embodiment 1, the material is used with which the maximum remanence of the hard magnetic film 3 becomes at least the remanence affording the favorable result described above in the present embodiment, and the thickness of the hard magnetic film 3 and that of an insulating film 7 are set so as to produce an appropriate bias field strength which is applied to the MR film 1 by the hard magnetic film 3, whereupon the expedient of adjusting the intensity of magnetization of the hard magnetic film 3 after the completion of the manufacture of the magnetic transducer is also employed. As in Embodiment 1, accordingly, the combined bias field strength (in which the component to be absorbed by the shields 4 and 4' is taken into consideration) of the magnetic fields established by the hard magnetic film 3 and the current flowing through the conductive film 2 may become the optimum bias point or higher, so that the material and thickness of the hard magnetic film 3 and the thickness of the insulating film 6 are not restricted.

Since the same conditions as in the foregoing description of Embodiment 1 may be satisfied, the material and thickness of the conductive film 2 are not restricted.

Further, a structure (not shown) in which the shields 4 and 4' are arranged through the insulating films 6 and 8 on both the sides of the structure as shown in each of FIGS. 9a–9c is substantially the same as the present embodiment except that the mutual positions of the respective constituents relative to the substrate 10 are different.

Besides, it is obvious that the effects mentioned in Embodiment 2 can also be attained by a structure (not shown) in which, on both the sides of the structure illustrated in Embodiment 2 wherein the conductive films 2 and 2' are arranged on both the sides of the MR film 1 and wherein the hard magnetic film is arranged in the vicinity of the MR film 1, the shields 4 and 4' are arranged through the insulating films 6 and 8 as in the present embodiment.

EMBODIMENT 4

Figure 15A:
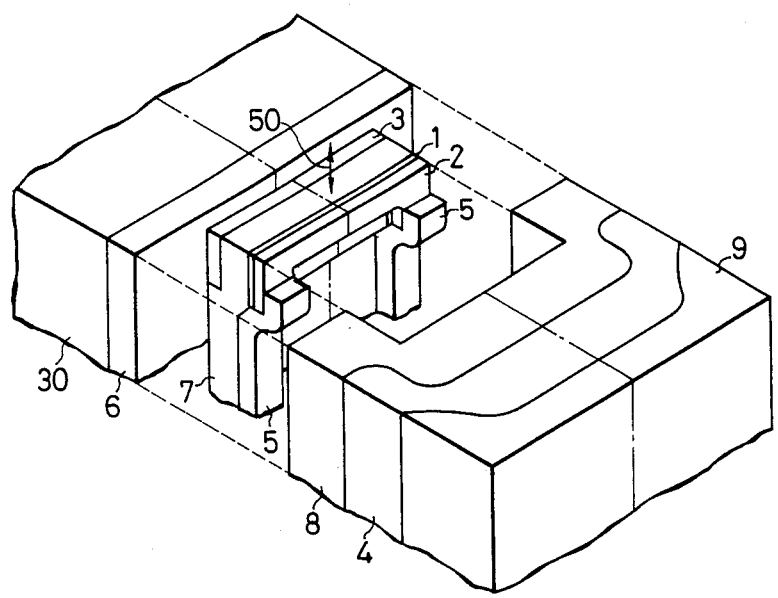
FIGS. 15a and 15b are an exploded perspective view and a sectional view showing a magnetic transducer in the fourth embodiment of the present invention, respectively.
Figure 15B:
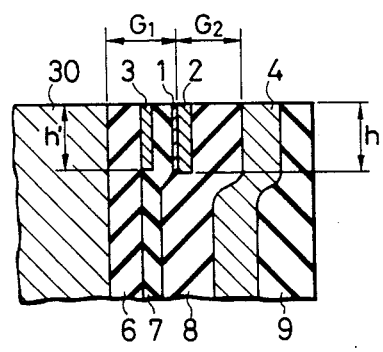

FIG. 15a shows the structure of a typical example of a magnetic transducer, using a magnetoresistance effect, in the present embodiment, while FIG. 15b shows a sectional view of portions indicated by dot-and-dash lines in FIG. 15a. On a substrate 30 which is made of an Ni-Zn ferrite, an Mn-Zn ferrite or any other desired soft magnetic material, a hard magnetic film 3 which is made of a hard magnetic material such as Co-Cr, Co-Ni or Co-Pt and which serves as a permanent magnetic film is formed through an insulating film 6 which is made of an inorganic insulator such as $Al_2O_3$ or $SiO_2$ or an organic insulator such as photoresist or resin. Next, through an insulating film 7 which is made of the same sort of insulator as that of the insulating film 6, there are formed an MR film 1 which is a thin film of a magnetic material of small coercive force made of an Ni-Fe alloy such as a permalloy, an Ni-Co alloy, an Ni-Fe-Co alloy or the like; a conductive film 2 which is made of an electric conductor such as titanium or molybdenum, that is not greatly different in resistivity from the material of the MR film and that is difficult of a diffusion reaction with the MR film 1; and electrodes 5 which are made of a material of low resistivity, e. g., gold or aluminum. Next, a shield 4 which is made of a soft magnetic material of high permeability, e. g., a permalloy alloy or an amorphous alloy is formed through an insulating film 8 which is made of the same sort of insulator as that of the insulating film 6. Further, the shield is covered with an insulating film 9 which is made of the same sort of insulator as that of the insulating film 6 and which protects the aforementioned hard magnetic film 3, MR film 1, conductive film 2, shield 4, electrodes 5, etc. from mechanical damages, corrosion, etc.

With such structure, it is the point of difference from Embodiment 3 that the substrate 30 plays the same role as that of the shield 4' in Embodiment 3, and the roles and operating contents of the other constituents including the conductive film 2, hard magnetic film 3, insulating film 7, shield 4 etc. are the same as in Embodiment 3.

In addition to the effects mentioned before in Embodiment 3, the present embodiment has the advantage that, since the substrate 30 itself plays the role of the shield, the shield 4' as in Embodiment 3 need not be specially formed, so the process of manufacture can be shortened.

The present embodiment is characterized in that the hard magnetic film in electrical insulation from the MR film and the conductive film in electrical contact with the MR film are comprised as the bias applying films on the substrate 30 made of the soft magnetic material, and that the shield made of the soft magnetic material is comprised on the side of the MR film 1 remote from the substrate 30. Therefore, the present embodiment also covers a magnetic transducer of a structure in which the shield 4 is formed through the insulator 8 after forming on the substrate 30 a structure (not shown) wherein the constituents such as the MR film 1, conductive film 2 and hard magnetic film 3 have only their positions relative to the substrate 30 charged as shown in any of FIGS. 9a–9c referred to in Embodiment 1, or a structure (not shown) wherein the hard magnetic film, and the conductive films disposed on both the sides of the MR film are comprised as described before in Embodiment 2.

Figure 16:
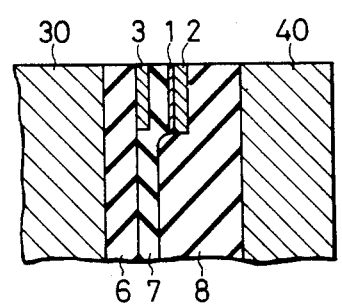
FIG. 16 is a sectional view showing a modification of the magnetic transducer in the third or fourth embodiment of the present invention.

A structure in which, as shown in FIG. 16, a soft magnetic member 40 made of the same sort of material as that of the substrate 30 is arranged in place of the foregoing shield 4 formed on the insulating film 8 is also covered within the present embodiment or Embodiment 3.

As described above, biasing magnetic fields to be applied to an MR film owing to a hard magnetic film functioning as a permanent magnetic film and current flowing through a conductive film functioning as a shunt biasing film act in accordance with the change of the height of the MR film conversely to each other in such a manner that, when one decreases, the other increases. Therefore, even when the height of the MR film element has changed, a combined bias field strength to be applied to the MR film element is difficult to change. Moreover, since the biasing magnetic field is applied through the two factors, a sufficient field strength can be attained, and the field strength can be readily adjusted to the optimum bias field strength. Further, since current for detecting a magnetoresistance effect shunts to the conductive film, current concentration on the MR film can be prevented even when defects appear in the MR film.

Thus, it is possible to realize a magnetoresistance effect type magnetic transducer which affords a favourable degree of vertical symmetry of a reproduced signal waveform, in which the degree of vertical symmetry of the reproduced signal waveform is difficult to change even when the height of an MR film has changed, and which has a high reliability.

Accordingly, a stable performance can be attained without rendering the finishing precision of the height of an MR element very high, and the rate of degradation of the performance attributed to the wear of the surface of the magnetic transducer is low, so the lifetime can be lengthened.

In the above, there has been explained the case where the conductive film is one provided in electrical contact with the MR film, or the so-called shunt biasing film. However, even when a conductive film is disposed on the MR film through an insulator and a transverse biasing magnetic field based on current flowing through this conductive film is utilized, it is possible to obtain a magnetoresistance effect type magnetic transducer which has the effect that the transverse biasing magnetic field does not change versus the change of h. Such embodiments will be described below.

EMBODIMENT 5

Figure 17A:
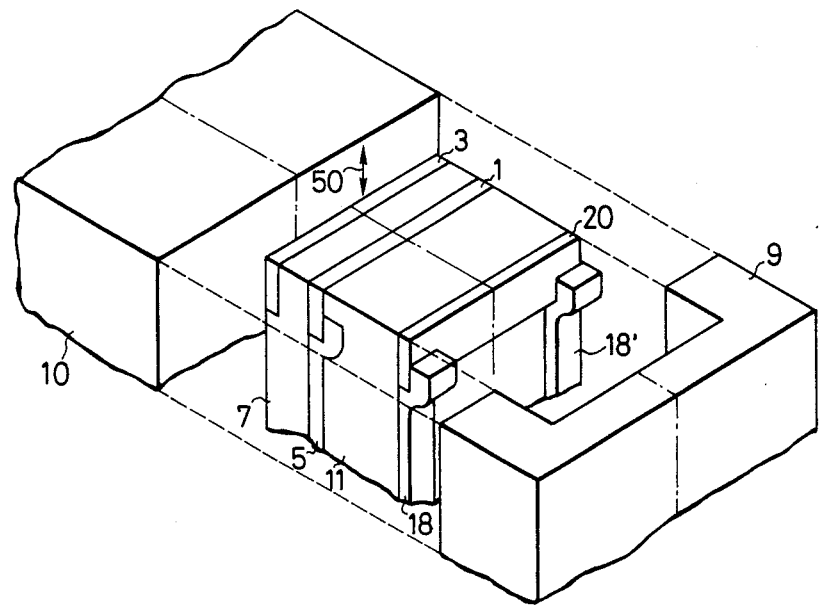
FIGS. 17a and 17b are an exploded perspective view and a sectional view showing a magnetic transducer in the fifth embodiment of the present invention, respectively.
Figure 17B:
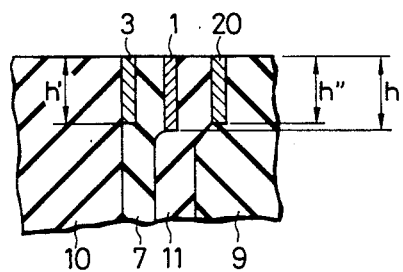

FIG. 17a shows the strucuture of a magnetic transducer, using a magnetoresistance effect, in the present embodiment, while FIG. 17b shows a sectional view of portions indicated by dot-and-dash lines in FIG. 17a. In Embodiment 1, the conductive film 2 has been disposed in electrical contact with the MR film 1, whereas in the present embodiment, a conductive film 20 is disposed through an insulating film 11.

More specifically, an MR film 1 is arranged in opposition to the conductive film 20 whose height h″ is substantially equal to the height h of the MR film, through the insulating film 11. The conductive film 20 is, e. g., a metal film made of a material such as Al or Mo which is readily formed by photolithography. Further, the MR film and the conductive film are formed with electrodes 5, 18, 18′ which are made of Al, Au or the like. The other portions have the same setups as in Embodiment 1.

It is the same as in Embodiment 1 that, after forming the magnetic transducer into the structure as shown in FIG. 17a, a magnetic field the strength of which brings the hard magnetic film to a predetermined remanence is applied in the direction of arrow 50 from outside of the magnetic transducer so as to magnetize the hard magnetic film 3.

Figure 18:
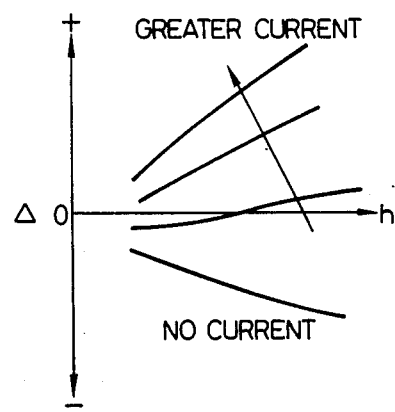
FIG. 18 is a graph showing the relationship between the height of an MR film and the degree of vertical symmetry of a reproduced signal waveform in the magnetic transducer of the fifth embodiment of the present invention.
Figure 19A:
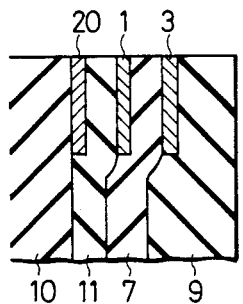
FIGS. 19a to 19e are sectional views each showing a modification of the magnetic transducer in the fifth embodiment of the present invention.
Figure 19B:
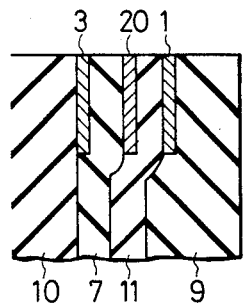
Figure 19C:
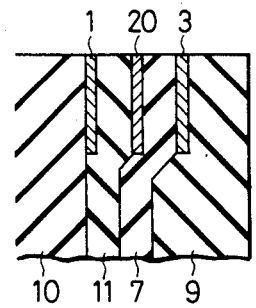
Figure 19D:
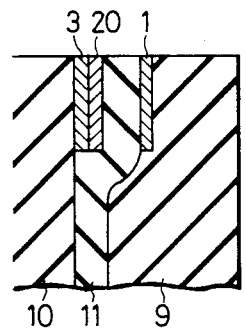
Figure 19E:
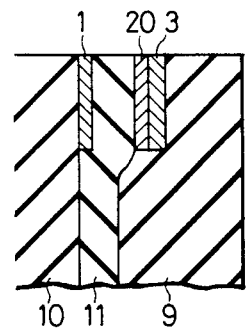

Shown in FIG. 18 is the relationship in the case of such structure between the height h of the MR film 1 and the degree of vertical symmetry $\Delta$ of a reproduced signal waveform illustrated in FIG. 4. The figure shows the change of $\Delta$ at the time at which current to flow through the conductive film 20 was changed with the remanence of the hard magnetic film 3 held constant. by properly selecting the remanence and the current magnitude to flow through the conductive film 20, it is possible to establish the state as in Embodiment 1 in which $\Delta$ hardly changes versus h.

A more concrete example of the present embodiment will be mentioned. The remanence of the hard magnetic film 3 is 3000 gausses and the thickness thereof is 1000 Å, the thickness of an insulating film 7 or 1 is 2000 Å, the thickness of the conductive film 20 is 500 Å, and the thickness of the MR film is 300 Å. On this occasion, when the current density of the current to flow through the conductive film 20 is set at 1.7 $10^{10}$ A/m², $\Delta$ becomes 15 to 5 % and the rate of change becomes within 10% within the range in which the height of the MR film 1 is 5–20 μm.

In this embodiment, the case has been described where the height h of the MR film 1, the height h′ of the hard magnetic film 3 and the height h″ of the conductive film 20 are approximately equal, and where they change simultaneously. As in Embodiment 1, however, the effects of the present invention are not limited by the height relations before the changes of these heights.

More specifically, in a case where h>h′, h″ holds in the initial state, the upper part of the MR film (the end opposite to the surface facing a recording medium) is biased by a magnetic field in the reverse direction, but the magnitude thereof is small, and besides, a signal from the recording medium arrives only partly and hardly contributes to the resistance variation of the MR film. Accordingly, effects at the simultaneous changes of h, h′ and h″ do not differ from those in the case of h=h′=h″.

In a case where h<h′, h″ holds, the biasing effect based on the current flowing through the conductive film is scarcely different from that in the case of h=h″, so that the change of the bias versus the change of the height exhibits the same tendency as in the case of h=h″. Meanwhile, the biasing effect from the hard magnetic film in the case of h<h′ is greatly differeht from that in the case of h=h′, but an average bias in the case of small h is better than in the case of great h and the tendency is the same as in the case of h=h′. It is accordingly obvious that similar effects are brought forth in the case of h<h′, h″.

For the present embodiment to have the foregoing effects, the hard magnetic film and the conductive film which are electrically insulated from the MR film are comprised as the films for applying the transverse biasing magnetic field, and the appropriate bias field strength is applied by combining the magnetic fields generated by the respective films. Thus, even when the respective positions of the hard magnetic film 3, MR film 1 and conductive film 20 are changed with respect to the substrate 10, effects do not differ from those of the present embodiment at all. In addition, the hard magnetic film 3 and the conductive film 20 may lie in electrical contact. By way of example, FIGS. 19a-19e show sectional structures similar to that of FIG. 17b, and they differ merely in the relative positions of the respective constituents. Symbols indicating the constituents are identical to those mentioned before.

The present embodiment also has the effect that, in case of employing a hard magnetic film which affords at least a remanence enough to afford a favorable biasing magnetic field, or in case of setting the thickness of the hard magnetic film or the thickness of the insulating film 7 so as to afford a magnetic field having a strength of at least the favorable biasing magnetic field, the magnetization of the hard magnetic film after the completion of the manufacture of the magnetic transducer can be employed as an expedient for adjusting the bias field strength.

Further, the present embodiment has the advantage that, since the conductive film is not in contact with the MR film, the resistance variation of the MR film can be derived as an output without being short-circuited by the conductive film.

EMBODIMENT 6

Figure 20:
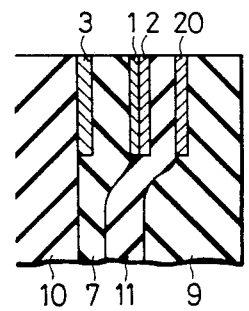
FIGS. 20, 21a and 21b are sectional views showing magnetic transducers in the sixth embodiment of the present invention.

FIG. 20 shows an example of a magnetic transducer, using a magnetoresistance effect, in the present embodiment as a sectional view similar to FIG. 17b. In the present embodiment, the MR film 1 of the magnetic transducer shown in Embodiment 5 is electrically contacted by a conductive film 2 which is made of titanium (Ti), molYbdenum (Mo) or the like difficult of a diffusion reaction with the MR film and which is formed so as to act as a shunt biasing film. In the present embodiment, the three of a biasing magnetic field based on current flowing through the conductive film 2 functioning as the shunt biasing film, a biasing magnetic field from current flowing through a conductive film 20 and a biasing magnetic field from a hard magnetic film 3 are combined and then applied to the MR film. Accordingly, when the magnitude of the current flowing through the conductive film 20 is adjusted according to the current flowing through the conductive film 2, the same effect as in Embodiment 4 or Embodiment 5 is attained.

For example, when the remanence of the hard magnetic film 3 was 3000 gausses and the thickness thereof was 1000 Å, the thickness of the insulating film 7 or 11 was 2000 Å, the thickness of the conductive film 20 was 500 Å, the thickness of the conductive film 2 was 200 Å, the current density of the conductive film 20 was $1.2 \times 10^{10}$ A/m$^2$ and the current density of the conductive film 2 was $0.5 \times 10^{10}$ A/m$^2$, there was obtained the effect as in Embodiment 5 that $\Delta$ was $-14\%$ to $5\%$ within the range in which the height of the MR film 1 was 5–20 μm.

With the present embodiment, even when defects exist in the MR film, currents at the defect parts bypass to the conductive film 2 functioning as the shunt biasing film, current concentration within the MR film 1 can be prevented, and the lifetime of the device can be lengthened.

Further, the present invention also has the advantage that, since the biasing magnetic fields from the conductive film 20 and the hard magnetic film 3 are great the conductive film (functioning as the shunt biasing film) 2 which is arranged in contact with the MR film 1 can be rendered sufficiently thin, so the influence of shortcircuiting the resistance variation of the MR film 1 by the shunt biasing film action of the conductive film 2 can be alleviated, and a greater output is obtained.

Figure 21A:
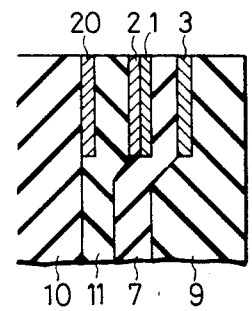
Figure 21B:
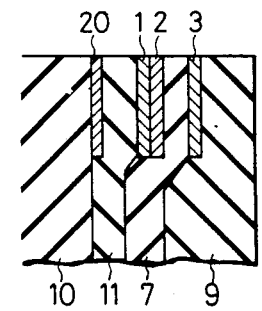

In the present embodiment, even when the positions of the MR film 1 and the conductive film (functioning as the shunt biasing film) 2 in contact with the MR film 1 have changed relative to the substrate 10, the effects of the present invention are quite equivalent and are not limited. Accordingly, the positions of the laminated film consisting of the MR film 1 and the conductive film 2 functioning as the shunt biasing film, the conductive film 20 and the hard magnetic film 3 relative to the substrate 10 are not restricted, either, as stated in Embodiment 5, and it is obvious that constructions equivalent to those shown in FIGS. 19a–19e, for example, constructions in FIGS. 21a and 21b corresponding to FIG. 19a have similar effects.

EMBODIMENT 7

Figure 22A:
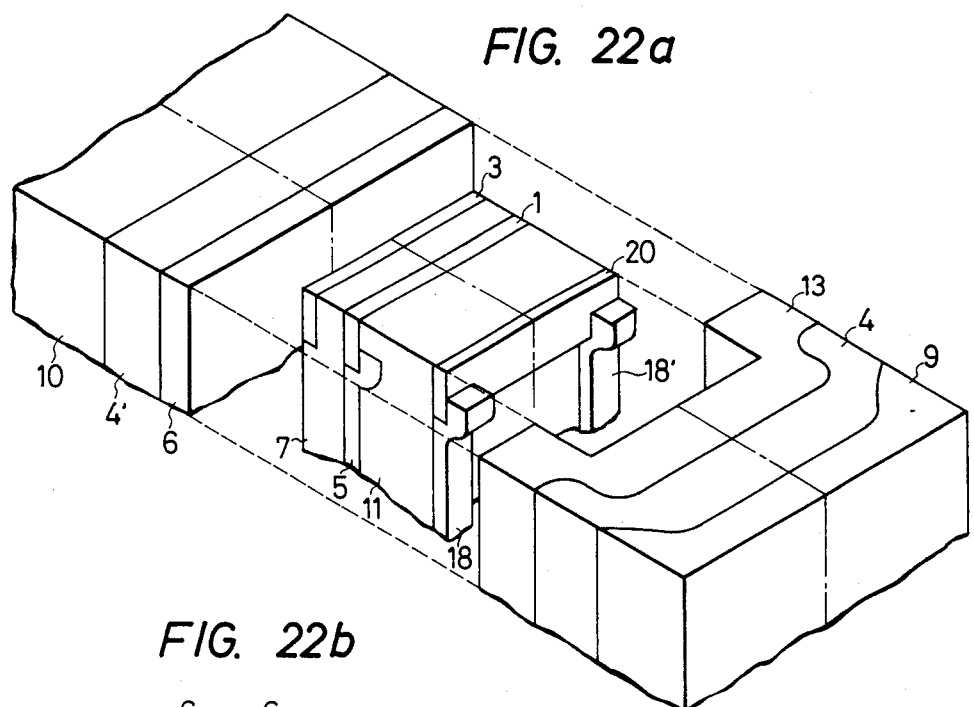
FIGS. 22a and 22b are an exploded perspective view and a sectional view showing a magnetic transducer in the seventh embodiment of the present invention, respectively.
Figure 22B:
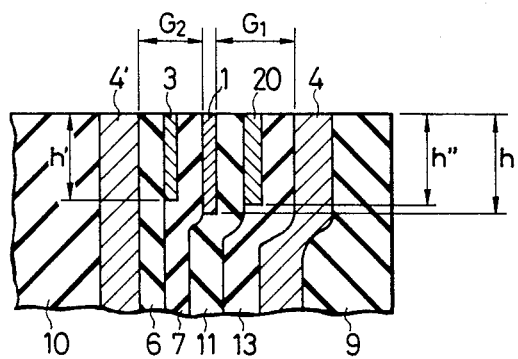

FIG. 22a shows an example of a magnetic transducer, using a magnetoresistance effect, in the present embodiment, while FIG. 22b shows a sectional view of portions indicated by dot-and-dash lines in FIG. 22a. The present embodiment is such that, on both the sides of the hard magnetic film, MR film and conductive film of Embodiment 5, shields 4 and 4' made of a soft magnetic material, for example, a permalloy alloy are arranged through insulating films 6 and 13 made of an inorganic material such as SiO$_2$ or Al$_2$O$_3$ or an organic material such as resin, in the same manner as in Embodiment 3.

The magnetic transducer of such structure is especially effective when the recording wavelength of magnetized information on a recording medium to be detected is short. The distances G$_1$, G$_2$ between the MR film 1 and the shields 4, 4' need to be set at an optimum value according to the minimum value of the recording wavelength to be detected, and the thickness may be approximately 0.5–10 μm ordinarily.

Figure 23:
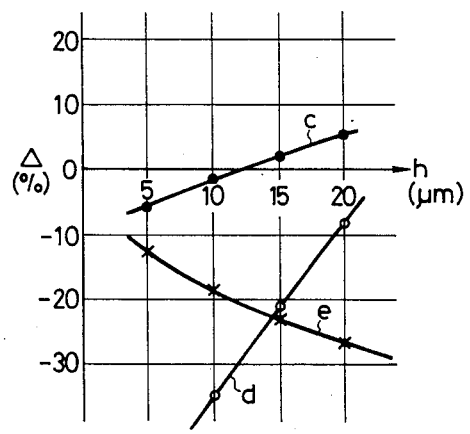
FIG. 23 is a graph showing the relationships between the height of an MR film and the degree of vertical symmetry of a reproduced signal waveform in the magnetic transducer of the seventh embodiment of the present invention and in a prior-art magnetic transducer.

A more concrete example of the present embodiment will be mentioned. When the height h of the MR film 1, that h' of the hard magnetic film 3 and that h'' of the conductive film 20 are rendered substantially equal in the initial state, $G_1 = G_2 = 0.8$ μm is set, the remanence of the hard magnetic film is 8000 gausses and the thickness thereof is 1000 Å, the thickness of the insulating film 7 or 11 is 2000 Å, the thickness of the conductive film 20 is 2000 μ, the thickness of the MR film 1 is 450 Å and the current density of the current to flow through the conductive film is $0.5 \times 10^{10}$ A/m$^2$, the relationship between h ($\approx$h'$\approx$h'') and $\Delta$ becomes as shown at (c) in FIG. 23, and better values of $\Delta$ than in a case of providing only the conductive film (d) or in a case of providing only the hard magnetic film (e).

Important in the present embodiment are that the hard magnetic film 3 and the conductive film 20 which are electrically insulated from the MR film are comprised as the films for applying the transverse biasing magnetic field, and that even when the magnetic fields established by the respective films are absorbed by the shield films 4 and 4', the combined appropriate bias field strength is applied to the MR film. As stated in Embodiment 5, accordingly, the present embodiment has the effect that the magnetization of the hard magnetic film after the completion of the manufacture of the magnetic transducer can be employed as the expedient for adjusting the bias field strength. Since the same conditions as those stated in Embodiment 5 may be satisfied, the material and thickness of the conductive film are not restricted. Further, no restriction is imposed on the height h of the MR film, that h' of the hard magnetic film and that h'' of the conductive film as in Embodiment 5.

Besides, a structure (not shown) in which the shields 4 and 4' are arranged on both the sides of the structure as shown in any of FIGS. 19a–19e is substantially the same as the present embodiment except that the mutual positions of the respective constituents relative to the substrate 10 are different.

It is obvious that the effects stated in Embodiment 6 are also attained by a structure (not shown) in which the shield films 4 and 4' are arranged on both the sides of the structure (shown in FIG. 20, 21a or 21b) illustrated in Embodiment 6 wherein the MR film is furnished with the thin conductive film (functioning as the shunt biasing film). Such structures are also covered within the present embodiment.

EMBODIMENT 8

Figure 24A:
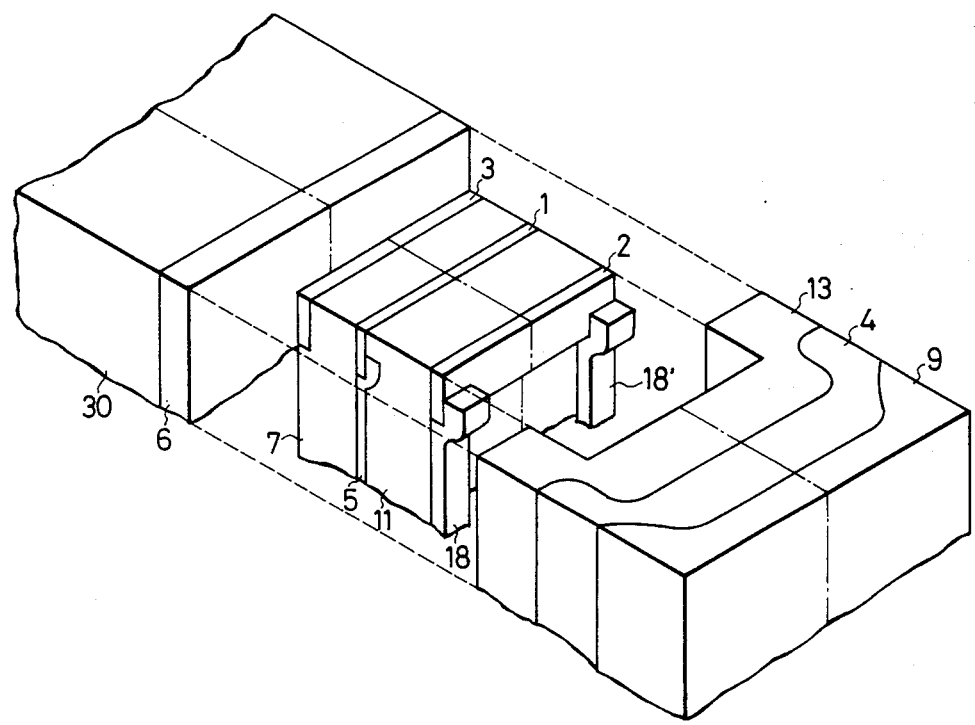
FIGS. 24a and 24b are an exploded perspective view and a sectional view showing a magnetic transducer in the eighth embodiment of the present invention, respectively.
Figure 24B:
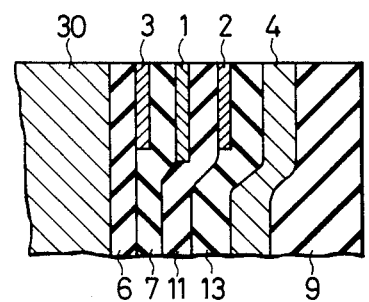

FIG. 24a shows the structure of an example of a magnetic transducer, using a magnetoresistance effect, in the present embodiment, while FIG. 24b shows a sectional view of portions indicated by dot-and-dash lines in FIG. 24a. The present embodiment is such that, in the magnetic transducer shown in Embodiment 5, a substrate 30 made of any desired soft magnetic material such as Ni-Zn ferrite or Mn-Zn ferrite is overlaid with a hard magnetic film 3 through an insulating film 6 made of an inorganic insulator such as Al$_2$O$_3$ or SiO$_2$ or an organic insulator such as resin, as in Embodiment 4. It is the point of difference from Embodiment 7 that the substrate 30 plays the same role as that of the shield 4' in Embodiment 7, and the roles and the operating contents of the other constituents such as the hard magnetic film 3, MR film 1 and conductive film 20 are similar to those of Embodiment 7.

Besides the effects mentioned in Embodiment 7, the present embodiment has the advantage that, since the substrate 30 itself functions as the shield, the step of forming the shield 4' as in Embodiment 7 can be omitted.

A magnetic transducer of a structure in which the shield 4 is formed through the insulator 13 after forming on the substratd 30 the setup explained in Embodiment 5 and shown in any of FIGS. 19a–19e wherein the arrangement of the constituents such as the MR film 1, conductive film 20 and hard magnetic film 3 is changed relative to the substrate 30, or the setup explained in Embodiment 6 wherein the MR film is furnished with the conductive film functioning as the shunt biasing film, is also a modification of the present embodiment.

Also a structure in which the shield 4 is arranged as the same sort of soft magnetic member as that of the substrate 30 is a modification of the present embodiment or Embodiment 7.

As described above, according to the present invention a magnetic transducer using a magnetoresistance effect can be realized in which, even when the heights of the respective constituents of the magnetic transducer such as an MR film and bias field applying means have changed, a combined bias field strength to be applied to the MR film is difficult to change. Moreover, since the bias applying means consists of the two sorts, a hard magnetic film and a conductive film, a sufficient field strength is attained, and the field strength can be readily adjusted to the optimum bias field strength.

What is claimed is:

1. A magnetic transducer using a magnetoresistance effect comprising (i) a magnetoresistive film, (ii) a hard magnetic film being arranged relative to said magnetoresistive film so as to apply a transverse biasing magnetic field to said magnetoresistive film, which hard magnetic film is magnetized in a direction approximately perpendicular to a surface facing a recording medium and which is disposed on said magnetoresistive film through an insulating film, and (iii) at least one conductive film which is stacked on said magnetoresistive film, the magnetic fields generated by the hard magnetic film and by causing a current to flow through the conductive film being complementary to each other with respect to changes in the heights of the films so as to suppress rate of change in the transverse biasing magnetic field relative to the rate of change of the heights of the films.

2. A magnetic transducer using a magnetoresistance effect as defined in claim 1, wherein said magnetoresistive film, said hard magnetic film and said conductive film are sandwiched between shielding soft magnetic members which are disposed through insulating films.

3. A magnetic transducer using a magnetoresistance effect as defined in claim 1, wherein said at least one conductive film is stacked on said magnetoresistive film in electrical contact therewith.

4. A magnetic transducer using a magnetoresistance effect as defined in claim 3, wherein the at least one conductive film is a plurality of conductive films, the conductive films being disposed on both sides of said magnetoresistive film.

5. A magnetic transducer using a magnetoresistance effect as defined in claim 4, wherein said magnetoresistive film, said hard magnetic film and said conductive film are sandwiched between shielding soft magnetic members which are disposed through insulating films.

6. A magnetic transducer using a magnetoresistance effect as defined in claim 5, wherein said soft magnetic members are soft magnetic films.

7. A magnetic transducer using a magnetoresistance effect as defined in claim 5, wherein one of said soft magnetic members serves also as a substrate.

8. A magnetic transducer using a magnetoresistance effect as defined in claim 3, wherein said magnetoresistive film, said hard magnetic film and said conductive film are sandwiched between shielding soft magnetic members which are disposed through insulating films.

9. A magnetic transducer using a magnetoresistance effect as defined in claim 8, wherein said soft magnetic members are soft magnetic films.

10. A magnetic transducer using a magnetoresistance effect as defined in claim 8, wherein one of said soft magnetic members serves also as a substrate.

11. A magnetic transducer using a magnetoresistance effect as defined in claim 1, wherein said at least one conductive film is stacked on said magnetoresistive film through an insulating layer.

12. A magnetic transducer using a magnetoresistance effect as defined in claim 11, comprising both the conductive film which is stacked on said magnetoresistive film through said insulating layer and the conductive film which is stacked on said magnetoresistive film in close and electrical contact therewith.

13. A magnetic transducer using a magnetoresistance effect as defined in claim 12, wherein said magnetoresistive film, said hard magnetic film and said conductive films are sandwiched between shielding soft magnetic members which are disposed through insulating films.

14. A magnetic transducer using a magnetoresistance effect as defined in claim 13, wherein one of said soft magnetic members serves also as a substrate.

15. A magnetic transducer using a magnetoresistance effect as defined in claim 11, wherein said magnetoresistive film, said hard magnetic film and said conductive film are sandwiched between shielding soft magnetic members which are disposed through insulating films.

16. A magnetic transducer using a magnetoresistance effect as defined in claim 15, wherein said soft magnetic members are soft magnetic films.

17. A magnetic transducer using a magnetoresistance effect as defined in claim 13, wherein said soft magnetic members are soft magnetic films.

18. A magnetic transducer using a magnetoresistance effect as defined in claim 15, wherein one of said soft magnetic members serves also as a substrate.

19. A magnetic transducer using a magnetoresistance effect as defined in claim 1, wherein the hard magnetic film has a thickness of 100 Å–3000 Å.

20. A magnetic transducer using a magnetoresistance effect as defined in claim 1, wherein the conductive film is made of a material selected from the group consisting of Mo, Ti, Au, Ta or Nb.

21. A magnetic transducer using a magnetoresistance effect as defined in claim 1, wherein the conductive film has a thickness of at least 150 Å.

* * * * *